United States Patent [19]
Jenik et al.

[11] 4,090,144
[45] May 16, 1978

[54] CIRCUIT ARRANGEMENT FOR RECOGNIZING ZERO TRANSITIONS OF SIGNALS

[75] Inventors: Franz Jenik, Munich; Peter Wentzel, Augsburg, both of Germany

[73] Assignee: Siemens Aktiengesellschaft, Berlin & Munich, Germany

[21] Appl. No.: 710,874

[22] Filed: Aug. 2, 1976

[30] Foreign Application Priority Data

Aug. 21, 1975 Germany .............................. 2537264

[51] Int. Cl.² .............................................. H03K 5/18
[52] U.S. Cl. ................................... 328/150; 307/354;
307/350; 307/234
[58] Field of Search ........... 307/235 R, 235 E, 235 N, 307/235 T, 268, 234; 328/119, 147, 150, 135, 115–117, 109, 111, 112

[56] References Cited
U.S. PATENT DOCUMENTS

| 3,505,537 | 4/1970 | Giordano | 307/235 T |
|---|---|---|---|
| 3,944,936 | 3/1976 | Pryor | 307/235 E |

Primary Examiner—John Zazworsky
Attorney, Agent, or Firm—Hill, Gross, Simpson, Van Santen, Steadman, Chiara & Simpson

[57] ABSTRACT

A circuit arrangement for recognizing zero transitions of signals includes a zero transition detector which receives the signals and an amplitude evaluator. The zero transition detector produces rectangular pulses which are assigned to the zero transition of the signals and the amplitude evaluator produces amplitude signals which, at least until the occurrence of the next zero transition, indicate that the amplitude of the signals was, prior to this particular zero transition, greater than the amount of a given threshold voltage. A switching stage is provided which is supplied with the rectangular signals and with the amplitude signals and which emits further signals at its output when the rectangular signals and the amplitude signals are present. A time filter is provided which is supplied with the further signals output by the switching stage, the time filter emitting pulses assigned to the further signals only when the interval of time between two changes in the further signals overshoots a given duration of time.

6 Claims, 5 Drawing Figures

4,090,144

CIRCUIT ARRANGEMENT FOR RECOGNIZING ZERO TRANSITIONS OF SIGNALS

BACKGROUND OF THE INVENTION

1. Field of the Invention

The present invention relates to a circuit arrangement for recognizing zero transition of signals, in which the signals are fed to a zero transition detector and to an amplitude evaluator, and more particularly to a circuit arrangement in which the zero transition detector produces rectangular signals which are assigned to the zero transitions of the signals, and in which the amplitude evaluator produces amplitude signals which, at least until the occurrence of the particular next zero transition, indicate that prior to this zero transition the amplitude of the signal was greater than a predetermined threshold voltage.

2. Description of the Prior Art

When data are transmitted from a data transmitter to a data receiver, it is frequently necessary for the zero transitions of signals representing the data to be established as accurately as possible. For example, in the case of the read-out of digital data stored on magnetic discs, it is necessary to precisely determine the zero transitions of different read-out signals assigned to these items of data.

It is conceivable to establish the zero transitions of the signals with the aid of a comparator whose inputs are fed with the signals as push-pull signals in inverted form and in non-inverted form. A comparator of this type emits from its output, for example, rectangular signals which change in binary value whenever the signals overshoot or undershoot the zero line. A comparator of this kind has the disadvantage, however, that the binary signals are emitted even when the signals are smaller than a given threshold value, or when the signals are disturbed in such a fashion that they contain dips which overshoot or undershoot the zero line.

It is also conceivable to provide an amplitude evaluator and to release the data pulses only when the amplitude of the signal is greater than a given threshold voltage prior to the zero transition. In this case, however, data pulses are also emitted when, due to dips, the signals temporarily overshoot or undershoot the zero line and the signal level was previously greater than the required threshold voltage.

SUMMARY OF THE INVENTION

The primary object of the present invention is to provide a circuit arrangement for recognizing the zero transitions of signals, which arrangement recognizes the zero transitions of the signals with a high degree of accuracy and produces no pulses in response to zero transitions when erroneous zero transitions occur.

The foregoing object is realized in a circuit arrangement of the type generally described above, in that a switching stage is provided which is fed with the rectangular signals and with the amplitude signals, the switching stage emitting further signals from its output when the rectangular signals and the amplitude signals are present. A time filter is provided which is supplied with the further signals and which, at its output, emits pulses assigned to these further signals only when the interval of time between two changes in the further signals exceeds a given length of time.

A circuit arrangement constructed in accordance with the present invention has the advantage that it recognizes the zero transitions of the signals while having a good resistance interference and thus a high degree of reliability is achieved in the analysis of the signals. In addition, the circuit arrangement requires a low outlay for materials and can thus be economically constructed.

If the circuit arrangement includes a zero transition detector which produces non-inverted and inverted rectangular signals, and an amplitude evaluator is provided which produces first and second amplitude signals in response to overshooting and undershooting, respectively, of a positive and a negative threshold voltage, it is advantageous if the switching stage contains a first NOR gate which is supplied with the non-inverted rectangular signals and the inverted first amplitude signals, a second NOR gate which is supplied with the inverted rectangular signals and the inverted second amplitude signals, and a third NOR gate whose inputs are connected to the outputs of the first and second NOR gate and at the output of which the further signals are emitted.

A simple construction of the time filter is achieved if the time filter contains a first time element which delays the further signals by a length of time which is shorter than the shortest permissible interval of time between two non-erroneous zero transitions of the signals, and a further time element which is connected to the output of the first time element and which delays the signal at its input by a length of time which is equal to the desired duration of the pulses, and if a fourth NOR gate is provided which is supplied with the signals at the inputs of the time elements and with the inverted signal from the output of the further time element, and which emits the pulses.

If the amplitude evaluator produces not only the amplitude signals, but also the threshold value signals, as long as the amplitude of the signals are greater than the given threshold value, and if a control signal is supplied which, when it occurs, prevents the emission of pulses, it is highly advantageous to provide a further switching stage which is supplied with the pulses, the threshold value signals and the control signal and which, at its output, blocks the emission of data pulses assigned to the pulses when the control signal is present and the threshold value signals are not present.

The blockage of the data signals is achieved with low expense if the second switching stage contains a fifth NOR gate which is supplied with the control signal and the threshold value signals, and a sixth NOR gate whose first input is connected to the output of the fifth NOR gate, whose second input is supplied with the pulses, and which emits the data pulses from its output.

The production of the amplitude signals is advantageously achieved in an amplitude evaluator which contains a first flip-flop and a second flip-flop whose pulse train inputs are supplied with the pulses, and whose setting and data inputs are supplied with first and second threshold value signals, respectively, which are produced as long as the signals overshoot a positive threshold voltage or undershoot a negative threshold voltage, respectively, and which emit the first and second amplitude signals, respectively, at their outputs.

In order to ensure a satisfactory operation of the circuit arrangement even when the operating voltage is switched on, it is advantageous for the amplitude evaluator to contain a further NOR gate which is supplied with the threshold value signals and the inverted amplitude signals and whose output is connected to the resetting signals of the flip-flops.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
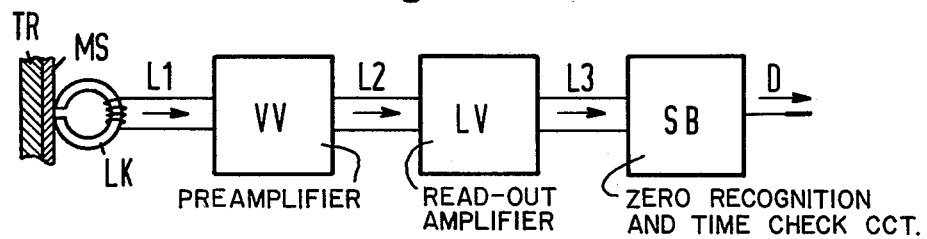
FIG. 1 is a block circuit diagram of an arrangement for the amplification and evaluation of read-out signals in magnetic layer memories.

In the circuit arrangement illustrated in FIG. 1, which serves to amplify and evaluate read-out signals in magnetic layer memories, such as for example magnetic disc memories, read-out signals L1 are induced in a read-out head LK in accordance with a change in the magnetization in a magnetic layer MS carried on a carrier TR. A preamplifier VV amplifies the read-out signals L1 and feeds the same as signals L2 to a read-out amplifier LV. The read-out amplifier differentiates and filters the signals L2 and emits at its output the differentiated read-out signals as the signals L3. A circuit arrangement SB senses the zero transitions of the signals L3 and with every correct zero transition produces a narrow rectangular pulse, which it emits as a data pulse D. In addition, it suppresses erroneous zero transitions which are triggered, for example, by strong dips in the signals L3 or by small signals L3 which only slightly overshoot or undershoot the zero line. For this purpose, the signals L3 are subjected to two criteria. It is interrogated whether the amplitude of the signal L3 was sufficiently large prior to the zero transition, and whether the signal L3 retains its polarity for a sufficient length of time after the zero transition. Only when both criteria are fulfilled does a data pulse appear.

When the circuit arrangement is used in a magnetic disc memory for the storage of digital data, a further criterion is introduced for the hunting of an address mark. An address mark is to be understoood as a point in the read-out track of a given length which is erased by d.c. and at which no items of data are stored. The function of the address mark, in free hunting, is to indicate when the address of a data block begins in the read-out track. In the hunting of such an address mark, it is interrogated, in the circuit arrangement, whether the amplitude following the zero transition is also sufficiently high. In this manner the forwarding of erroneous zero transitions within the address mark is prevented. The data pulses may be fed to a monostable trigger stage which produces pulses of a given length. Then, the pulses are supplied to an analysis device (not shown) which produces timing pulses which are assigned to the data pulses, and which uses the timing pulses to regain the stored data from the data pulses.

Figure 2:
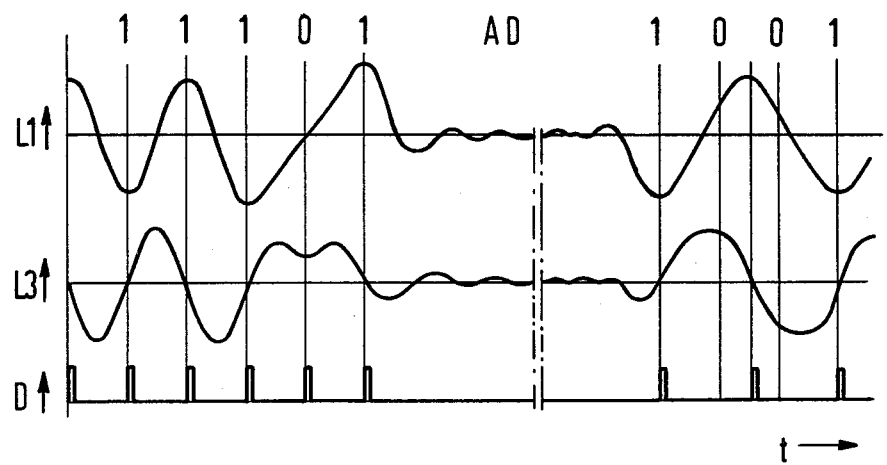
FIG. 2 is a time chart of signals at various points of the arrangement illustrated in FIG. 1.

In the timing diagrams illustrated in FIG. 2, the instantaneous values of the read-out signals L1, the signals L3 and the data pulses D are represented in the ordinate direction, and time $t$ is represented in the direction of the abscissa. It has been assumed that the known modified non-return-to-zero recording mode, also known as the MFM mode, has been used as the recording method for the storage of the digital data. In this method of recording, a binary character "1" is assigned a change in the magnetization on the magnetic layer MS of the magnetic disc. In addition, a change in the magnetization also occurs in the center between two binary characters "0".

On the read-out of the stored items of data, in the read-out head, the read-out signal L1 is induced which, for example, in the event of the storage of a sequence of binary characters 11101, in in the case of an address mark AD and in the event of a sequence of binary characters 1001 has the wave form illustrated in FIG. 2.

The differentiated read-out signal is emitted as the signal L3 at the output of the read-out amplifier LV, the zero transitions of the signal being assigned to the maxima and minima of the read-out signal L1. The circuit arrangement SB produces the data pulses D at the zero transitions of the read-out signal L3. During the read-out of the address mark AD, however, no data pulses D are to be produced.

Figure 3:
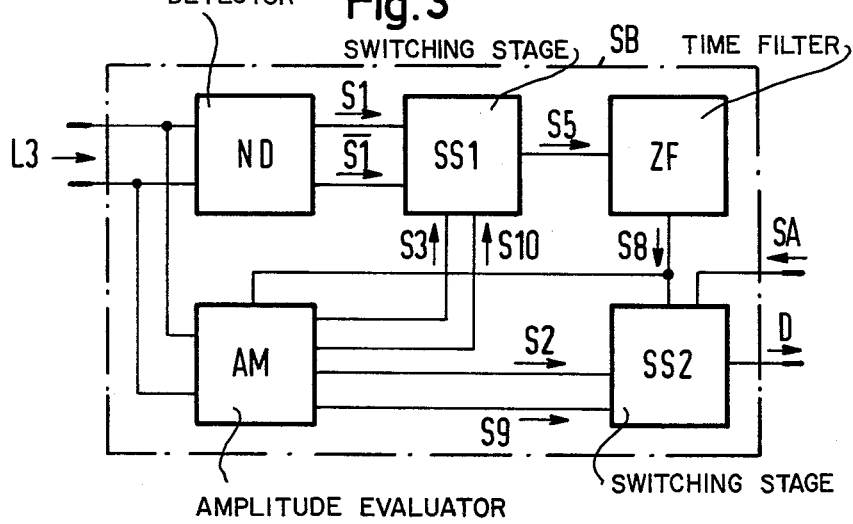
FIG. 3 is a block circuit diagram of a circuit arrangement for the recognition of the zero transitions of signals.

The circuit arrangement SB illustrated in FIG. 3 contains a zero transition detector ND, an amplitude evaluator AM, two switching stages SS1 and SS2 and a time filter ZF. The signal L3 is present as a push-pull signal at the input of the zero transition detector ND and with every zero transition of the signal L3 the zero transition detector ND emits a rectangular signal S1 and an inverted rectangular signal $\overline{S1}$ to the switching stage SS1. With each zero transition of the signals L3, the rectangular signals S1 and $\overline{S1}$ change their binary value.

The signals L3 are also present at the input of the amplitude evaluator AM and in response to the overshooting and the undershooting of a positive and a negative threshold voltage U1 and U2, respectively, the amplitude evaluator AM emits a threshold value signal S2 and S9, respectively, to the switching stage SS2. The amplitude evaluator AM contains storage elements which store the occurrence of the threshold value signals S2 and S9. At the output of the storage elements amplitude signals S3 and S10 are emitted which are assigned to the threshold value signals S2 and S9, respectively, and which are fed to the switching stage SS1. The switching stage SS1 logically links the amplitude signals S3 and S10 to the rectangular signals S1 and $\overline{S1}$ and at its output emits further signals S5 which change in binary value with each zero transition of the signals L3 and again change in binary value between the zero transitions of the signals L3, provided that the signals L3 are not distorted.

In the time filter ZF, which fundamentally consist of a timing element Z1 and a pulse shaper, the signals S5 are filtered in such a manner that no changes in the signals S5 are taken into account when the interval of time between the changes is smaller than a predetermined duration of time. This predetermined duration of time is shorter than one third of the smallest permissible interval of time between two undisturbed zero transitions of the signals L3. At the output of the time filter ZF short pulses S8 are emitted which are assigned to the zero transitions of the signals L3.

The pulses S8, together with the threshold value signals S2 and S9, are supplied to the switching stage SS2. In addition, the switching stage SS2 is fed with a control signal SA which blocks the further transmission of the pulses S8 when an address mark AD is being hunted for and, in this case, no data pulses D are to be produced.

Figure 4:
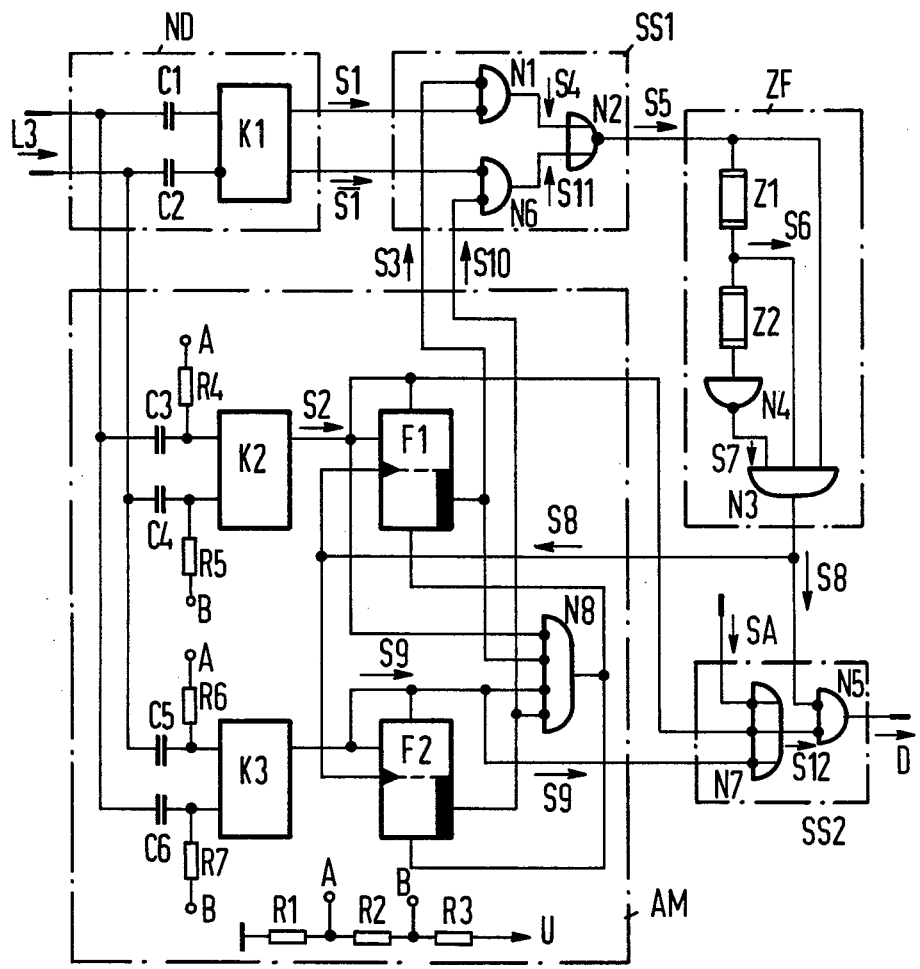
FIG. 4 is a schematic logic diagram of the circuit arrangement illustrated in FIG. 3.

FIG. 4 is a circuit diagram of the circuit arrangement SB. The mode of operation of the circuit arrangement SB will, in the following, be described together with the timing diagrams illustrated in FIG. 5 of the signals at various points of the circuit arrangement SB, in which the instantaneous values of the signals are illustrated in the ordinate direction and the time t is plotted in the abscissa direction. With the exception of the signals L3, all of the signals are binary signals which assume only the binary values designated "0" and "1".

The zero transition detector ND comprises a comparator K1 having inputs which are supplied with the signal L3 as a push-pull signal by way of a pair of capacitors C1 and C2 and which emits the rectangular signals S1 and $\overline{S1}$ at its output. Comparators of this type are generally known in the art and can be obtained, for example, from the Motorola company under the number C 1651.

The amplitude evaluator AM contains two further comparators K2 and K3, which are supplied with the signals L3 by way of capacitors C3 to C6 and which, at their outputs, emit the threshold value signals S2 and S9 when the signals L3 overshoot a positive threshold voltage U1 or undershoot a negative threshold voltage U2. The threshold voltages U1 and U2 are produced by a voltage divider comprising three resistors R1 to R3 and are fed by way of a plurality of resistors R4 to R7 to the inputs of the comparators K2 and K3.

When the signal L3 exceeds the zero line at the time t1, the rectangular signal S1 assumes the binary value "1". At the same time, the rectangular signal $\overline{S1}$ assumes the binary value "0". At the time t2 the signal L3 also exceeds the threshold voltage U1 and the threshold value signal S2 assumes the binary value "1". The threshold value signal S2 sets a flip-flop F1 and at its inverting output the amplitude signal S3 assumes the binary value "0".

At the time t3, the rectangular signal S1 again assumes the binary value "0". Since the amplitude signal S3 likewise has the binary value "0", by way of a NOR gate N1 the signal S4 is emitted and a further signal S5 is emitted at the output of a further NOR gate N2 as the binary value "0", the NOR gate N2 being connected to the output of the NOR gate N1.

Figure 5:
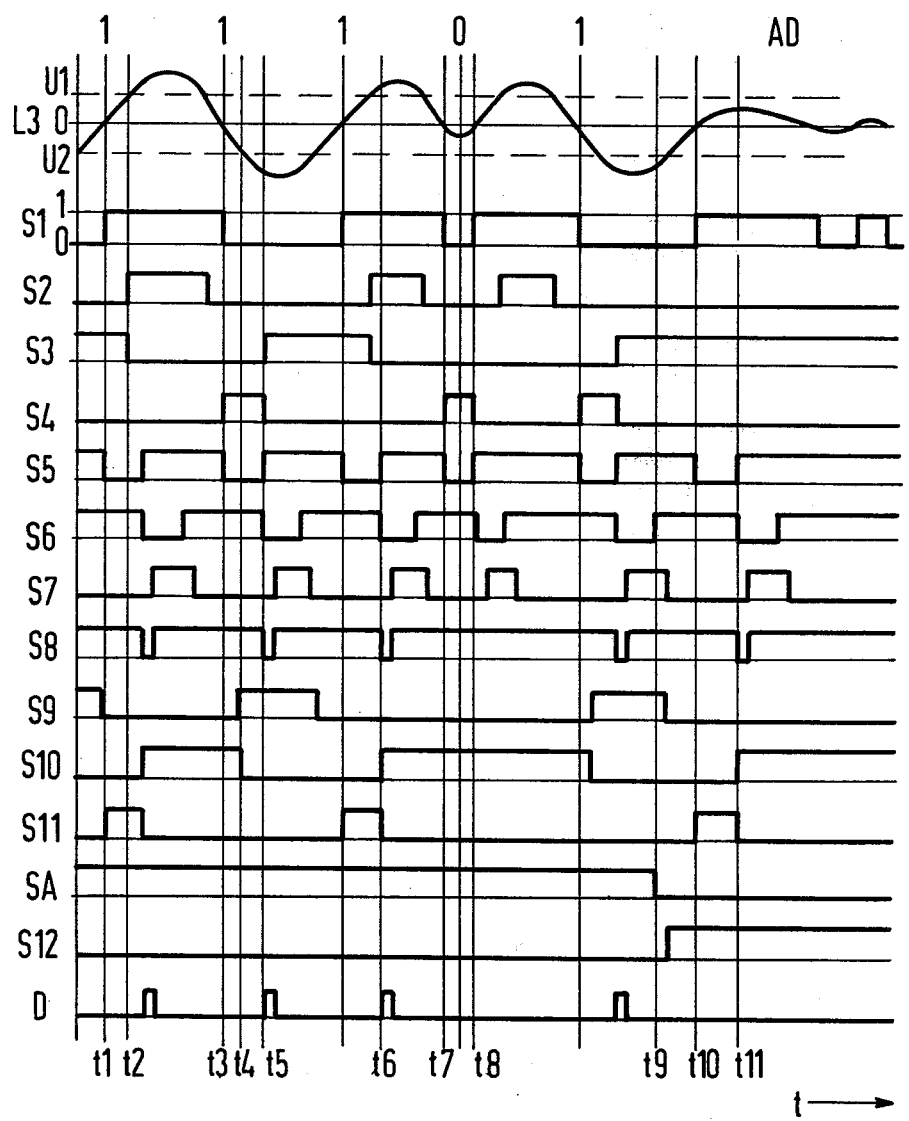
FIG. 5 is a timing diagram of signals located at various points of the circuit arrangement illustrated in FIG. 4.

The signal S5 in the time filter ZF is fed to a first input of a OR gate N3 and, by means of a time element Z1, is delayed by a length of time which in the illustration in FIG. 5 is equal to one third of the interval of time between two stored binary characters. A signal S6 at the output of the time element Z1 is fed, on the one hand, to a further input of the OR gate N3 and, on the other hand, to a second time element Z2. The time element Z2 delays the signal S6 by a length of time which is equal to the desired duration of the pulses S8 at the output of the time filter ZF. The signal S6 is inverted by means of an inverter N4 and is likewise supplied to the OR gate N3. At its output, the NOR gate N3 emits the inverted pulses S8.

At the time t5, the pulse S8 assumes the binary value "0". After the delay time of the time element Z2, this pulse and the data pulse D have ended. Therefore, this pulse resets the flip-flops by way of a pulse train input. In addition, the pulse S8 is emitted as a data pulse D by way of a NOR gate N5. When the flip-flop F1 is reset, the amplitude signal S3 reassumes the binary value "1" and the signals S4 and S5 also change in binary value.

A similar procedure occurs when, at the time t4, the signal L3 undershoots the negative threshold voltage U2 and the signal S10 at the inverting output of the flip-flop F2 assumes the binary value "0". A NOR gate N6 produces a signal S11 when the rectangular signal $\overline{S1}$ and the amplitude signal S10 have the binary value "0". Thus again, a signal S5 is produced by way of the NOR gate N2 and by way of the time filter ZF, at the time t6, a data pulse D is produced which is assigned to the zero transition of the signal L3 between the time t5 and the time t6.

Between the times t7 and t8, because of an excessive dip, the signal L3 incorrectly undershoots the zero line again, and the rectangular signal S1 assumes the binary value "0". As the amplitude signal S3 simultaneously has the binary value "0", the signals S4 and S5 are produced. The signal S5 is again delayed in the time filter ZF. However, a pulse S8 cannot be emitted from the output of the OR gate N3 as the length of time during which the zero line was undershot was not greater than the delay time of the time element Z1. Therefore, a data pulse D is not emitted from the output of the switching stage SS2. In this manner, an erroneous evaluation of the read-out signals L1 can be avoided. Similarly, no pulses S8 are produced when, in the event of dips in negative signals, the zero line is temporarily overshot. The zero transition at the time t8 is not analyzed as the corresponding amplitude signal was not previously produced.

At the time t9, the control signal SA which is produced during a hunting process after an address mark, assumes the binary value "0". When the threshold value signals S2 and S9 also have the binary value "0", a signal S12 at the output of a NOR gate N7 assumes the binary value "1" and blocks the NOR gate N5 from further emission of data pulses D. For example, the pulses S8 are blocked which are assigned to a zero transition of the signal L3 at the time t10. When the signal L3 exceeds the zero line at the time t10, a pulse S8 is produced at the time t11, similarly as between the times t1 and t5. As, however, no further threshold value signal is produced after the zero transition, this pulse is blocked by the signal S12 across the NOR gate N5 so that a data pulse D is not emitted.

In order to ensure a satisfactory operation even when the operating voltage of the circuit arrangement is switched on, the amplitude evaluator AM contains a NOR gate N8 which is fed with a threshold value signals S2 and S9 and with the amplitude signals S3 and S10, and which emits a signal which resets the flip-flops F1 and F2. This prevents the two flip-flops F1 and F2 from being set in response to turn-on transients, and therefore prevents the NOR gates N1 and N6 from being constantly open. In this case, the signal S5 would always have the binary value "0" and it would not be possible to produce a pulse S8 to reset the flip-flops F1 and F2.

Although we have described our invention by reference to a particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A circuit arrangement for recognizing and time checking zero transitions of data signals, comprising:
   a zero transition detector for receiving the data signals and producing rectangular signals in response to zero transitions of the data signals, said zero transition detector comprising means for producing said rectangular signals as complementary inverted and non-inverted rectangular pulses;
   an amplitude evaluator for receiving the data signals and producing amplitude signals which indicate that a data signal is, prior to a zero transition, greater than a given threshold value, said amplitude evaluator comprising means for emitting said amplitude signals as first and second amplitude signals in response to overshoot and undershoot of respective positive and negative threshold values;
   a switching stage connected to said zero transition detector and to said amplitude evaluator and operable to emit further signals in response to the presence of both rectangular and amplitude signals, said switching stage comprising a first NOR gate connected to receive said non-inverted rectangular pulses and said first amplitude pulses, a second NOR gate connected to receive said inverted rectangular signals and said second amplitude pulses, and a third NOR gate connected to said first and second NOR gates for producing said further signals; and
   a time filter connected to said switching stage and responsive to said further signals to emit corresponding output pulses only when the interval of time between two changes in said further signals exceeds a given duration of time.

2. The circuit arrangement of claim 1, wherein:
   said amplitude evaluator includes threshold signal means for providing threshold value signals in response to data signal amplitudes greater than the given threshold value; and
   said arrangement also comprises
      a control signal input for receiving a control signal, and
      a second switching stage connected to said control signal input, to said amplitude evaluator threshold signal means and to said time filter and responsive to block emission of data pulses corresponding to said output pulses when said control signal is present and said threshold value signals are not present.

3. The circuit arrangement of claim 2, wherein said second switching stage comprises:
   a first NOR gate connected to receive said control signal and said threshold value signals; and
   a second NOR gate connected to said first NOR gate and to said time filter for emitting the output pulses as data pulses when not blocked by said first NOR gate.

4. The circuit arrangement of claim 2, wherein said amplitude evaluator comprises:
   first and second flip-flops, each of said flip-flops including
      a trigger input connected to said time filter to receive said output pulses,
      an input connected to said threshold value signal means for receiving threshold value signals, and
      an output connected to the first-mentioned switching stage to provide said amplitude signals.

5. The circuit of claim 4, wherein:
   each of said flip-flops includes a reset input; and
   said amplitude evaluator comprises a NOR gate having inputs connected to said threshold value signal means and to said outputs of said flip-flops and an output connected to said reset inputs.

6. A circuit arrangement for recognizing and time checking zero transitions of data signals, comprising:
   a zero transition detector for receiving the data signals and producing rectangular signals in response to zero transitions of the data signals, said zero transition detector comprising means for producing said rectangular signals as complementary inverted and non-inverted rectangular pulses;
   an amplitude evaluator for receiving the data signals and producing amplitude signals which indicate that a data signal is, prior to a zero transition, greater than a given threshold value, said amplitude evaluator comprising means for emitting said amplitude signals as first and second amplitude signals in response to overshoot and undershoot of respective positive and negative threshold values;
   a switching stage connected to said zero transition detector and to said amplitude evaluator and operable to emit further signals in response to the presence of both rectangular and amplitude signals, said switching stage comprising a first NOR gate connected to receive said non-inverted rectangular pulses and said first amplitude pulses, a second NOR gate connected to receive said inverted rectangular signals and said second amplitude pulses, and a third NOR gate connected to said first and second NOR gates for producing said further signals; and
   a time filter connected to said switching stage and responsive to said further signals to emit corresponding output pulses only when the interval of time between two changes in said further signals exceeds a given duration of time, said time filter comprising a first time delay element connected to said third NOR gate for delaying said further signals by an amount which is less than a predetermined shortest permissible time between two non-faulty zero transitions of said data signals, a second time delay element connected to said first time delay element for delaying the delayed further signals by a predetermined interval of time equal to the desired duration of said output pulses, an inverter connected to said second time delay element, and a fourth NOR gate connected to receive said further signals and the delayed further signals and the twice delayed and inverted further signals to produce said output signals.

* * * * *